United States Patent
Chung et al.

(10) Patent No.: US 6,836,299 B2
(45) Date of Patent: Dec. 28, 2004

(54) TFT LCD DEVICE HAVING MULTI-LAYERED PIXEL ELECTRODES

(75) Inventors: Woo-Suk Chung, Anyang-shi (KR); Chang-Won Hwang, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 156 days.

(21) Appl. No.: 09/911,613

(22) Filed: Jul. 25, 2001

(65) Prior Publication Data

US 2002/0109797 A1 Aug. 15, 2002

(30) Foreign Application Priority Data

Feb. 12, 2001 (KR) .......................................... 2001-06820

(51) Int. Cl.[7] .............................................. G02F 1/136
(52) U.S. Cl. .......................... 349/42; 349/147; 257/72; 257/59
(58) Field of Search .............................. 257/72, 51, 59; 349/42, 147

(56) References Cited

U.S. PATENT DOCUMENTS

| | | | | |
|---|---|---|---|---|
| 5,917,563 A | * | 6/1999 | Matsushima | 349/38 |
| 5,923,390 A | * | 7/1999 | Jung Mok et al. | 349/38 |
| 5,989,945 A | * | 11/1999 | Yudasaka et al. | 438/149 |
| 6,081,310 A | * | 6/2000 | Katsuya et al. | 349/113 |
| 6,291,136 B1 | * | 9/2001 | Masutani et al. | 430/312 |
| 6,323,521 B1 | * | 11/2001 | Seo | 257/347 |
| 6,358,759 B1 | * | 3/2002 | Hirabayashi | 438/7 |
| 6,509,942 B2 | * | 1/2003 | Tanaka et al. | 349/113 |
| 6,519,014 B2 | * | 2/2003 | Ha | 349/43 |
| 6,620,660 B2 | * | 9/2003 | Ohtani et al. | 438/158 |
| 6,678,017 B1 | * | 1/2004 | Shimomaki et al. | 349/40 |
| 2001/0020994 A1 | * | 9/2001 | Kaneko et al. | 349/147 |
| 2001/0024187 A1 | * | 9/2001 | Sato et al. | 345/98 |
| 2001/0040649 A1 | * | 11/2001 | Ozaki | 349/43 |
| 2002/0057394 A1 | * | 5/2002 | Takahashi et al. | 349/43 |
| 2002/0066902 A1 | * | 6/2002 | Takatoku | 257/72 |
| 2002/0106586 A1 | * | 8/2002 | You | 430/311 |

FOREIGN PATENT DOCUMENTS

| | | | |
|---|---|---|---|
| JP | 56-50537 | * | 5/1981 |
| JP | 5-82768 | * | 4/1993 |
| JP | 5-216069 | * | 8/1993 |
| JP | 10-90719 | * | 4/1998 |
| JP | 10-186412 | * | 7/1998 |
| JP | 10-282520 | * | 10/1998 |
| JP | 11-87716 | * | 3/1999 |
| JP | 2000-29053 | * | 1/2000 |

* cited by examiner

Primary Examiner—Nathan J. Flynn
Assistant Examiner—Ahmed N. Sefer
(74) Attorney, Agent, or Firm—McGuireWoods LLP

(57) ABSTRACT

In a TFT LCD device comprising a substrate, at least one thin film transistor formed on the substrate, having a source electrode and a drain electrode, an insulating layer formed over the whole surface of the substrate on which the thin film transistor is formed, having at least one contact hole exposing a portion of the drain electrode, and reflective layer pixel electrode corresponding to the thin film transistor, formed on the insulating layer to be connected with the drain electrode through the contact hole, the pixel electrode is formed of a multi-layered conductive layer. The drain electrode is composed of multiple layers, and the most upper layer of the multiple layers is one selected from a Cr layer and a MoW layer. Preferably, the multi-layered conductive layer is composed of two-layered conductive layer having a lower layer of the same material as that of the most upper layer and an upper layer of Al-containing metal.

13 Claims, 5 Drawing Sheets

TFT LCD DEVICE HAVING MULTI-LAYERED PIXEL ELECTRODES

FIELD OF THE INVENTION

The present invention relates to a thin film transistor liquid crystal display (TFT LCD) device, and more particularly to a reflective or transflective TFT LCD device having multi-layered pixel electrodes connected to drain electrodes with interposing an insulating layer therebetween.

BACKGROUND OF THE INVENTION

TFT LCD devices are generally classified into a reflective TFT LCD device using a reflective layer as pixel electrodes, a transmissive TFT LCD device using transparent pixel electrodes, and a transflective TFT LCD device using a reflective layer having a transmissive region in a portion of a reflective region as pixel electrodes, according to reflectance or permeability of pixel electrodes. In the TFT LCD devices, to supply voltage for controlling arrangement of liquid crystal to the pixel electrodes, drain electrodes of thin film transistors formed in each pixel are connected to the corresponding pixel electrodes. The pixel electrodes are generally connected to the drain electrodes through via holes formed in an interlayer insulating layer.

In a transmissive TFT LCD device, pixel electrodes use indium oxides to form transparent electrodes. However, this material may cause a problem that oxidizes wires of aluminum (Al) to form insulating oxides and thereby hinders in supplying voltage to the pixel electrodes. Therefore, in the transmissive TFT LCD device, drain electrodes are formed of a single layer of metal such as chromium (Cr), or a two-layered conductive layer having an Al-contained metal layer and a molybdenum tungsten (MoW) or Cr layer formed on the Al-contained metal layer.

In a reflective TFT LCD device, pixel electrodes usually use aluminum neodymium (AlNd). In this case, materials forming drain electrodes are also limited. Referring to FIG. 1, a pixel portion of the reflective TFT LCD device using an easily oxidized metal such as Al as source and drain electrodes 21, 21' is illustrated. On the source and drain electrodes 21, 21', a protecting layer 23, for example a photosensitive organic insulating layer is disposed. The protecting layer 23 has via holes for connecting the drain electrodes 21' to the pixel electrodes 27. Therefore, in an exposure, development and cleaning process of photolithography for forming the via holes, if developer or detergent of strong oxidant contacts the drain electrodes 21' through the via holes, the upper layer of the drain electrodes 21' may form insulating oxides 25. The insulating oxides 25 increase contact resistance between the drain electrodes 21' and pixel electrodes 27.

To solve the problem, an upper layer 212' of the drain electrode 21' can be formed of metal such as MoW that is resistant against oxidation, as shown in FIG. 2. However, in this case, battery effect, like inside a chemical battery, can be occurred due to difference of electro-negativity between the upper layer 212' of the drain electrode 21' and an Al-containing reflective layer forming the pixel electrodes 27. For example, due to corroding by the battery effect, gaps 29 similar to spike phenomenon generating at the interface between a silicon layer and an Al layer can be formed at the interface between the upper layer 212' and the Al-containing reflective layer. Also, as a portion of the Al-containing reflective layer around the gaps 29 falls, the Al-containing reflective layer can generate cracks 31 around the via holes. These gaps 29 or cracks 31 cause a problem increasing contact resistance between the pixel electrodes 27 and the drain electrodes 21'.

Generally, the battery effect increases in proportion to the difference of surface area and electronegativity between two metal layers. Accordingly, the drain electrodes 21' that usually has relatively very small surface area compared to the pixel electrodes 27 enforces the battery effect more, thereby increasing the contact resistance between the pixel electrodes 27 and the drain electrodes 21' more.

To solve the battery effect, it can be considered to use a MoW or Cr layer as reflective plates or pixel electrodes 27. However, such a choice deteriorates reflectance and conductivity of the pixel electrodes.

Accordingly, a new TFT LCD device, which can prevent increase of contact resistance due to the battery effect or surface oxidation at the interface between the pixel electrodes and the drain electrodes with maintaining highly reflectance and conductivity, is required.

SUMMARY OF THE INVENTION

It is an object of the present invention to provide an improved TFT LCD device that can prevent battery effect at the interface between pixel electrodes and drain electrodes, while maintaining high reflectance and conductivity.

It is another object of the present invention to provide an improved TFT LCD device that can prevent insulating oxides at the interface between pixel electrodes and drain electrodes, while maintaining high reflectance and conductivity.

It is other object of the present invention to provide an improved TFT LCD device that can prevent contact resistance increase at the interface between pixel electrodes and drain electrodes, while maintaining high reflectance and conductivity.

These and other objects are provided, according to the present invention, by a TFT LCD device having pixel electrodes formed of a multi-layered conductive layer. Preferably, drain electrodes are composed of multiple layers, and the most upper layer of the multiple layers is composed of a metal layer that is strongly resistant against oxidation. Also, the multi-layered conductive layer is composed of two-layered conductive layer having a lower layer of metal that has small electro-negativity difference between itself and the most upper layer of the drain electrodes and an upper layer of Al-containing metal.

In the present invention, the lower layer of the two-layered conductive layer is preferably composed of the same material as that of the most upper layer of the drain electrodes, for example one selected from a Cr layer and a MoW layer. The Al-containing metal usually uses pure Al or AlNd. Accordingly, the two-layered conductive layer is formed by depositing the lower layer of one selected from a Cr layer and a MoW layer and the upper layer of Al-containing metal and then patterning them.

It is noted that the multi-layered conductive layer is not limited to the two-layered conductive layer. To reduce the battery effect efficiently, if necessary, an intermediate metal layer can be interposed between the lower and upper layers of the two-layered conductive layer.

The multiple layers of the drain electrodes usually use metal having a high conductivity to prevent a signal voltage drop due to the data line resistance. Also, the drain electrodes are formed of the same conductive material as that of the data lines connected to source electrodes. Accordingly, the multiple layers forming the drain electrodes are preferably composed of a two-layered layer having an Al layer for increasing conductivity and a Cr or MoW layer strongly resistant to oxidation formed on the Al layer, or a three-layered layer having an intermediate Al layer and an upper and a lower Cr or MoW layers formed on and under the intermediate Al-contained layer to prevent spike phenomenon due to silicon layers over an active area. When the drain electrodes formed along with the data lines are of the three-layered layer, the MoW layer as the lower and upper layer preferably is better than the Cr layer since it is easy to be patterned along with the intermediate Al-containing layer.

According to the present invention, since the upper layer of the drain electrodes and the lower layer of the pixel electrodes are formed of same material or metals having small differences in electro-negativity, the battery effect therebetween can be ignored. Also, in the two-layered conductive layer of the pixel electrodes, the upper layer and the lower layer are concurrently formed to have the same surface area by means of same patterning process. This may result in difference in electro-negativity, but battery effect can be prevented. Thus, at the interface between the pixel electrodes and the drain electrodes, the battery effect is considerably reduced and the spike phenomenon or cracks is prevented.

Also, since the upper layer of the drain electrodes is composed of a metal layer strongly resistant to oxidation, insulating oxides are not formed on the upper surface thereof even though it is exposed to oxidizing material such as developer or detergent, and thereby preventing contact resistance increase.

DETAILED DESCRIPTION OF PREFERRED EMBODIMENTS

The present invention now will be described more fully hereinafter with reference to the accompanying drawings, in which a preferred embodiment of the invention is shown. This invention may, however, be embodied in many different forms and should not be construed as limited to the embodiment set forth herein. Like numbers refer to like elements throughout.

Figure 1:
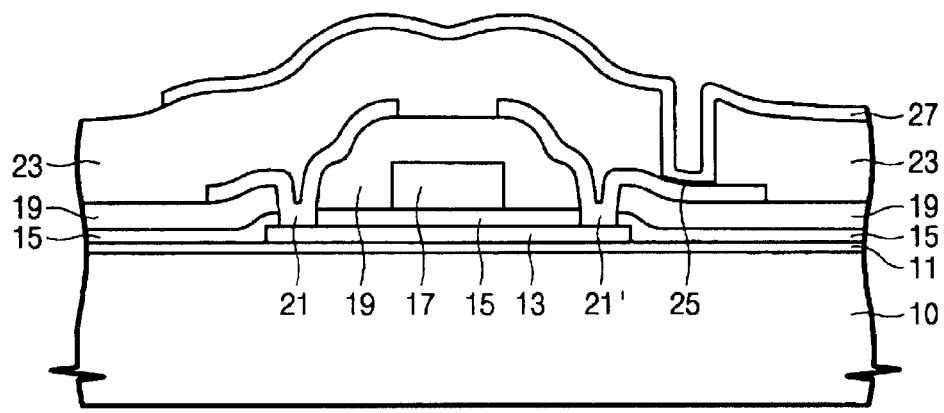
FIG. 1 and FIG. 2 are cross-sectional views of a pixel portion of a conventional reflective TFT LCD device.
Figure 2:
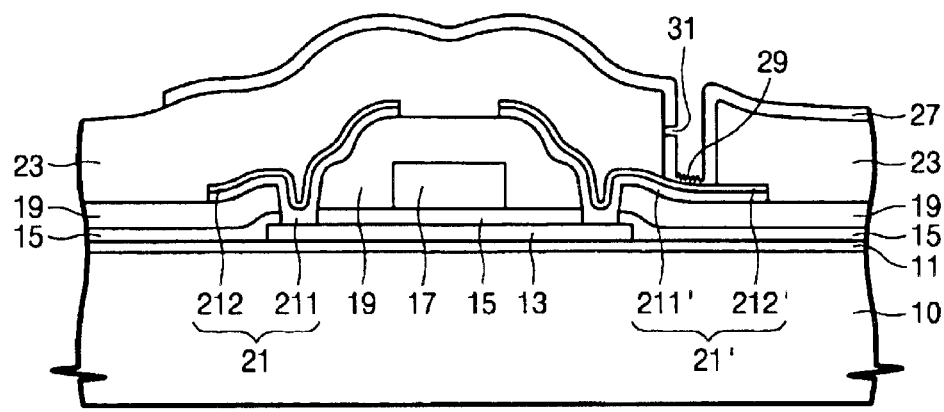
Figure 3:
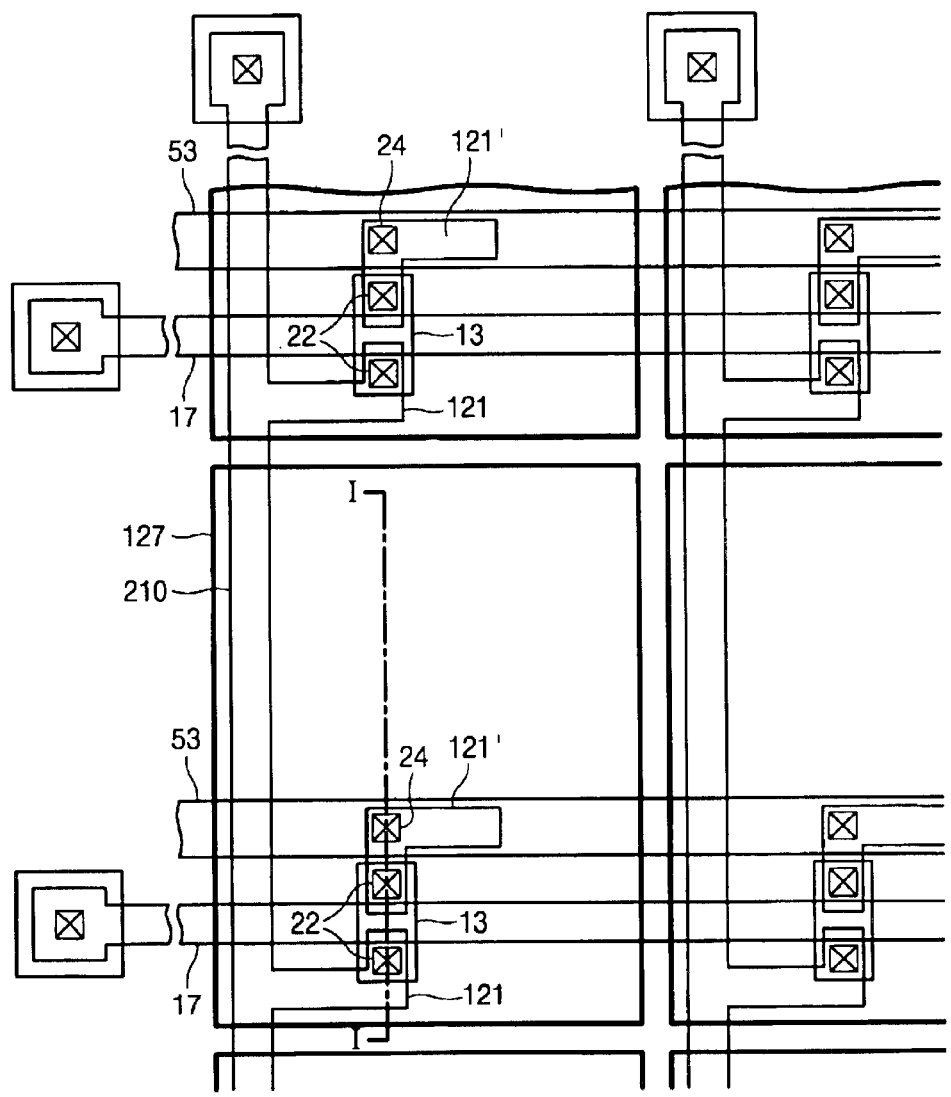
FIG. 3 is a top plan view showing a layout of pixel portions of a top gate type polysilicon TFT LCD device in accordance with one embodiment of the present invention.

FIG. 3 is a top plan view showing a layout of pixel portions of a top gate type polysilicon TFT LCD device in accordance with one embodiment of the present invention. Referring to FIG. 3, it can be appreciated that in the top plan view, the pixel portions of the TFT LCD device of the present invention has the same structure as a general reflective or transmissive TFT LCD device. Namely, the TFT LCD device has an active region pattern 13 formed on a substrate, a gate insulating layer (15 of FIG. 4) formed on the active region pattern 13, and thin film transistors formed on the gate insulating layer 15. The thin film transistors have gate lines 17 including a plurality of gate electrodes, each of which divides a line or bar shaped sub-region of the active region pattern 13 into two portions with crossing the active region pattern 13.

The gate electrodes which form a portion of the gate lines 17 formed in a transverse direction are covered by an interlayer insulating layer (19 of FIG. 4) formed on the gate lines 17. In the interlayer insulating layer 19, contact holes 22 are formed to connect source and drain electrodes 121, 121' with the two portions of each line shaped sub-region of the active region pattern 13 divided by the gate electrodes. The source and drain electrodes 121, 121' formed respectively over the two portions are composed of a conductive layer. Of the source and drain electrodes 121, 121', the source electrodes 121 are connected to data lines 210. The data lines 210 composed of a conductive layer of the same material as the source and drain electrodes 121, 121' are disposed in a direction vertical to the gate lines 17.

On the source and drain electrodes 121, 121' and the data line 210, a protecting layer (23 of FIG. 4) is formed. The protecting layer has via holes 24 exposing a portion of each drain electrode 121'. Pixel electrodes 127 composed of a conductive layer are formed on the protecting layer to be connected with the drain electrodes 121' through 20 the via holes 24. Storage lines 53 for supplying capacitance are formed parallel to the gate lines 17.

It is natural that the structure of the pixel portions of the TFT LCD device of the present invention described above is the same as that of a conventional TFT LCD device, since the present invention is characterized that pixel electrodes are not formed of a single layer, but of a multi-layered conductive layer.

Figure 4:
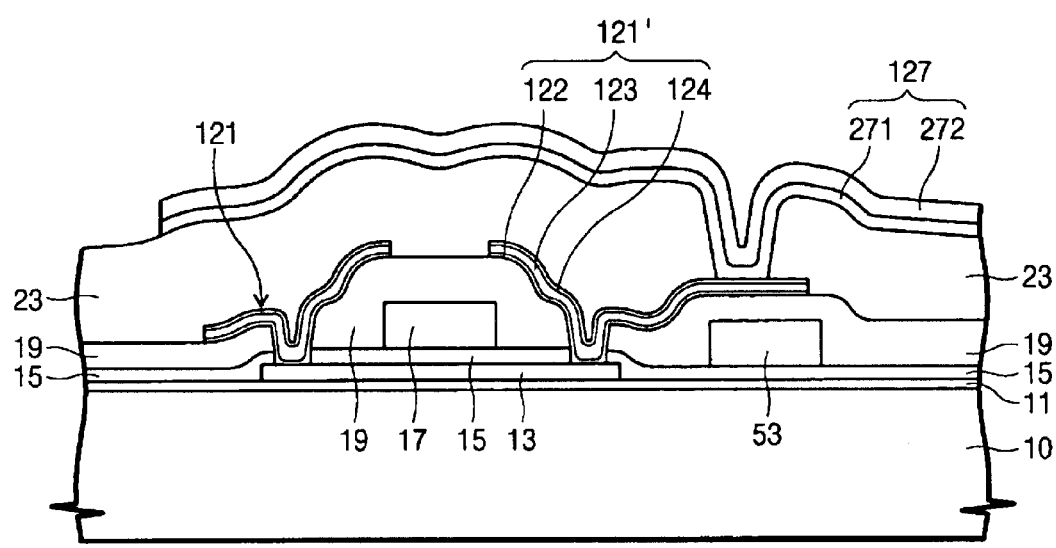
FIG. 4 shows a cross-section taken along line 1—1 of FIG. 3.

FIG. 4 shows a cross-section taken along line 1—1 of FIG. 3. A top gate polysilicon type thin film transistor is disposed on a substrate 10. Source and drain electrodes 121, 121' of the transistor formed on an interlayer insulating layer 19 are connected to source and a drain regions through the contact holes 22 in the interlayer insulating layer 19. The source and drain electrodes 121, 121' are composed of three-layered metal layer having a lower MoW layer 122, an intermediate AlNd layer 123, and an upper MoW layer 124. On the source and drain electrodes 121, 121', the protecting layer 23 composed of a photo-sensitive organic insulating layer is formed to a thickness of several μm. The protecting layer 23 has via holes formed on the drain electrodes 121'. The drain electrodes 121' are connected through the via holes to the pixel electrodes 127 formed on the protecting layer 23. The pixel electrodes 127 are composed of a lower MoW layer 271 and an upper AlNd layer 272.

A method for manufacturing a TFT LCD device in accordance with the present invention will now be described. FIG. 5 through FIG. 8 are diagrams showing the process steps of forming a pixel portion of the TFT LCD device of FIG. 4.

Figure 5:
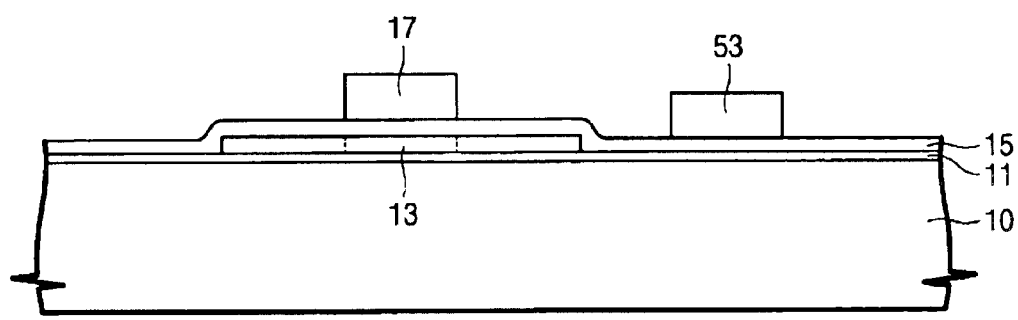
FIGS. 5, 6, 7 and 8 are diagrams showing the process steps of a method for manufacturing a pixel portion of the top gate type polysilicon TFT LCD device shown in FIG. 4.

Referring to FIG. 5, first, an amorphous silicon layer is formed on a substrate 10. Then, the amorphous silicon layer is transformed into a polysilicon layer by performing a laser annealing process. Generally, before the amorphous silicon layer is formed, a silicon oxide layer can be formed as a blocking layer 11 to a thickness of several hundred to 1000 Å. An then, the polysilicon layer is patterned to form an active region pattern 13 having a plurality of line or bar shaped portions. On the active region pattern 13, a gate insulating layer 15 is deposited. The gate insulating layer 15 is formed by depositing a silicon oxide layer or a silicon nitride layer to a thickness of one hundred to several hundred Å by a chemical vapor deposition (CVD) method. On the gate insulating layer 15, gate lines 17 are formed. Storage lines 53 are also formed along with the gate lines 17. The gate lines 17 are composed of a single metal layer containing Al, or a multi-layered metal layer including an Al-containing metal layer and a MoW layer or a Cr layer. It will be noted that each gate line 17 includes a gate electrode and a gate pad in a pixel.

An ion implantation is performed to the active region pattern 13 by using the gate electrodes as an ion implantation mask. Thus, a line shaped portion of the active region pattern 13 is divided into an source and an drain regions. The ion implantation process is performed twice to each of n-type and p-type impurities since in the polysilicon LCD device, n-type transistors along with p-type transistors are generally disposed at a peripheral portion. In each ion implantation process, an ion implantation mask is formed.

Figure 6:
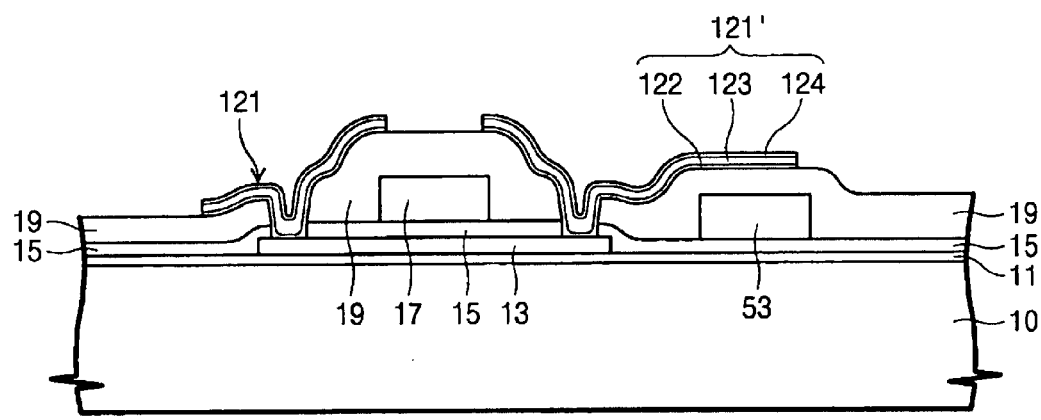

Referring to FIG. 6, a silicon nitride layer or a silicon oxide layer is deposited on the gate line 17 to form a interlayer insulating layer 19 by a CVD method. On the source and drain regions, the interlayer insulating layer 19 and the gate insulating layer 15 are removed to form contact holes 22 exposing a portion of the active region pattern 13. Then, a three-layered metal layer having a lower MoW layer 122, an intermediate AlNd layer 123, and an upper MoW layer 124 is formed over the whole surface of the substrate by a sputtering method. Thereafter, the three-layered metal layer is patterned by using a photo-resist pattern as an etch mask to form source and drain electrodes 121, 121' and data lines ( not shown in FIG. 5).

The embodiment of the present invention described above shows an example of a low temperature polysilicon TFT LCD device having an active region formed of polysilicon, but the present invention can be also applied to an amorphous silicon TFT LCD device having an active region formed of amorphous silicon, which a laser annealing process is not performed after a amorphous silicon layer is formed. Also, the present invention can be applied to a bottom gate type TFT LCD devices as well as a top gate type TFT LCD device.

Figure 7:
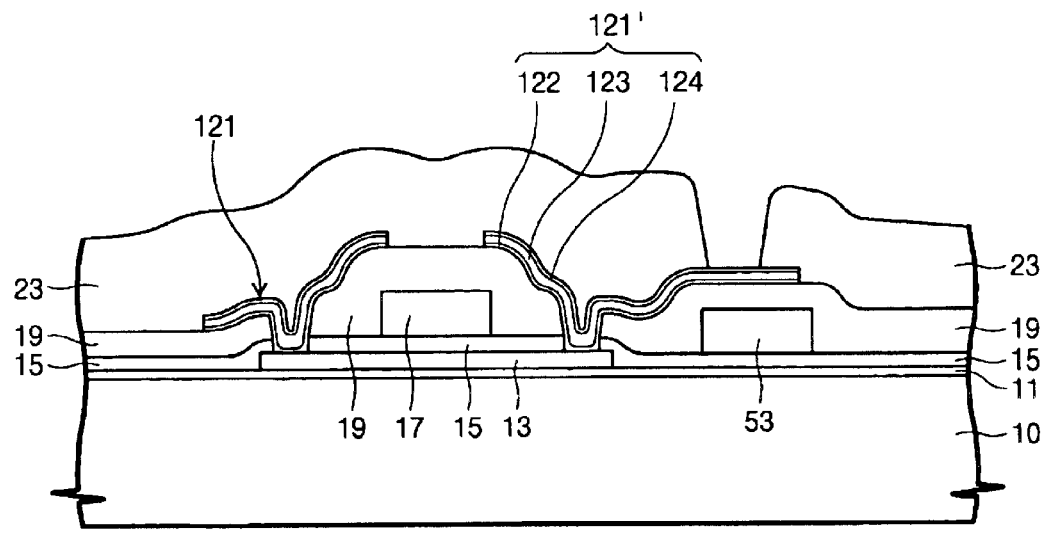

Referring to FIG. 7, a protecting layer 23 is formed of a photo-sensitive organic insulating layer over the whole surface of the substrate 10. The photo-sensitive organic insulating layer is convenient compared with other insulating layers since it can be patterned without a separate etching process. Then, via holes are formed to exposure a portion of each drain electrode 121' by means of a photo-exposure and development process. At this time, a developer of strong oxidizing properties contacts the drain electrodes 121' through the via holes. However, since the upper layer 124 of the drain electrodes 121' is composed of MoW that is strongly resistant to oxidation, it does not form insulating oxides. Also, by controlling the photo-exposure, coarse projections can be formed on the upper surface of the protecting layer 23. The coarse projections form micro lens to enhance condensing efficiency of reflective plates or pixel electrodes 127 which are formed later.

Figure 8:
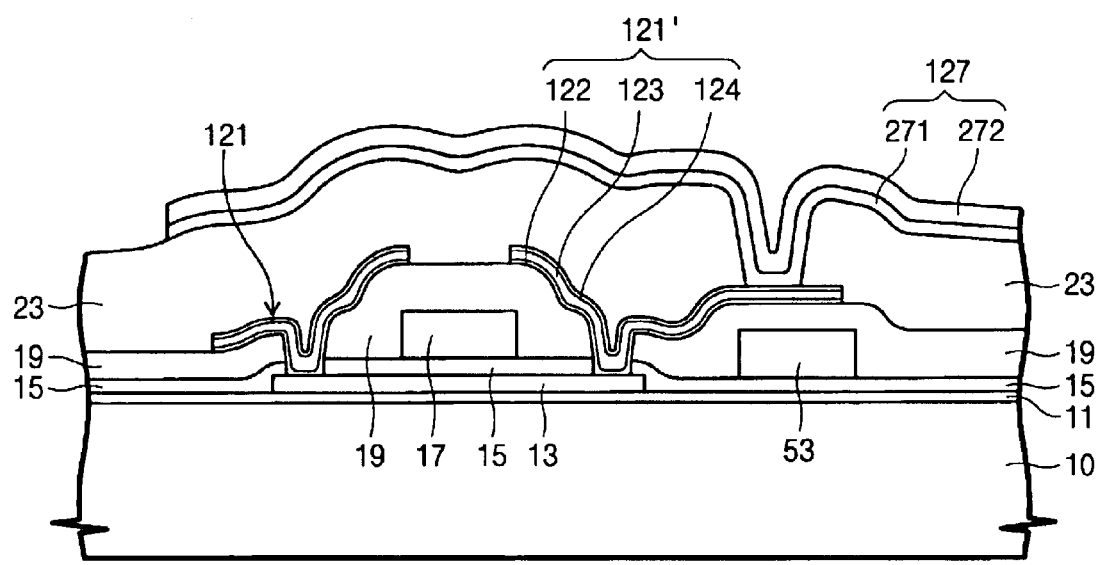

Referring to FIG. 8, a lower MoW and an upper AlNd layers 271, 272 are continuously formed as lower and upper layers of pixel electrodes 127 by a sputtering process. Then, the lower MoW and the upper AlNd layers 271, 272 are etched by using a photoresist pattern as an etch mask to form double layered reflection plates, i.e., double layered pixel electrodes 127. The MoW layer is convenient compared with a Cr layer since it can be continuously etched with the AlNd layer. It is possible that other conductive metal layer is interposed between the MoW layer and the AlNd layer.

For example, since a large electro-negativity between the lower and the upper metal layers 271, 272 of the pixel electrodes 127 forming the reflective plate can increase the battery effect due to material difference, it can be considered that a buffer metal layer of electro-negativity having a middle level of the lower and the upper metal layers 271, 272 be interposed therebetween.

The embodiment of the present invention described above shows a reflective TFT LCD device using a reflective layer as pixel electrodes, but the present invention is not limited to the embodiment. The present invention can be also applied to a transflective TFT LCD as well as the reflective TFT LCD. For example, After a protecting layer exposing a portion of each drain electrode is formed, a pixel electrode pattern is formed in a pixel area. The pixel electrode pattern is composed of transparent electrodes. Then, a Cr and an Al layers are continuously formed over the whole surface of a substrate over which the transparent electrode are formed, and patterned to form a reflective layer pixel electrode pattern having windows in a portion of the pixel area. The drain electrodes are composed of three-layered metal layer having a lower MoW layer, an intermediate Al layer, and an upper MoW layer. In this example, the upper layer of the drain electrodes and the lower layer of the pixel electrodes are not formed of same materials, but a problem due to direct contact between the lower Al layer of the pixel electrodes and the upper layer of the drain electrodes can be considerably reduced.

As apparent from the foregoing description, it can be appreciated that the present invention provides a TFT LCD device which can prevent electrochemical effect such as battery effect having bad influence on the fabrication process, thereby preventing damage of reflective electrodes and increasing reflectance thereof to obtain more high definition.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A thin film transistor liquid crystal device (TFT LCD), comprising:
   a substrate;
   a thin film transistor formed on said substrate and having a source electrode and a drain electrode, wherein the drain electrode is formed of multiple layers comprising an uppermost layer formed of Cr or MoW;
   an insulating layer formed over said thin film transistor and having a contact hole exposing a portion of the drain electrode; and
   a pixel electrode formed on said insulating layer, and connected to the drain electrode through the contact hole, wherein the pixel electrode is formed of multiple layers comprising a lower layer formed of the same material as the uppermost layer of the drain electrode and an upper layer formed of metal containing Al.

2. The TFT LCD according to claim 1, wherein the pixel electrode further comprises an intermediate layer formed between the upper layer and the lower layer and formed of a material having an electro-negativity that is between that of the lower layer and that of the upper layer.

3. The TFT LCD according to claim 1, wherein the multiple layers further comprises a lower layer formed of MoW and an intermediate metal layer containing Al.

4. The TFT LCD according to claim 1, wherein said thin film transistor is a top-gate type polysilicon thin film transistor.

5. The TFT LCD according to claim 1, wherein said insulating layer is formed of a photo-sensitive organic insulating layer.

6. The TFT LCD according to claim 1, further comprising a plurality of small projections formed on an upper surface of said insulating layer and works as micro lens.

7. A thin film transistor liquid crystal device (TFT LCD), comprising:
 a substrate;
 a thin film transistor formed on said substrate and having a source electrode and a drain electrode, wherein the drain electrode is formed of Cr or MoW;
 an insulating layer formed over said thin film transistor and having a contact hole exposing a portion of the drain electrode; and
 a pixel electrode formed on said insulating layer and connected to the drain electrode through the contact hole,
 wherein said pixel electrode is multi-layered and comprises a lower layer formed of the same material as the drain electrode.

8. The TFT LCD of claim 7, wherein the pixel electrode further comprises an upper layer formed of metal containing Al.

9. The TFT of claim 7, wherein the pixel electrode further comprises an intermediate layer formed between the upper layer and the lower layer and formed of a material having an electro-negativity that is between that of the lower layer and that of the upper layer.

10. The TFT LCD according to claim 7, wherein the drain electrode is multi-layered and comprises an upper formed of Cr or MoW, a lower layer formed of MoW and an intermediate metal layer containing Al.

11. The TFT LCD according to claim 7, wherein said thin film transistor is a top-gate type polysilicon thin film transistor.

12. The TFT LCD according to claim 7, wherein said insulating layer is formed of a photo-sensitive organic insulating layer.

13. The TFT LCD according to claim 7, further comprising a plurality of small projections formed on an upper surface of said insulating layer and works as micro lens.

* * * * *